US006948084B1

(12) United States Patent
Manapat et al.

(10) Patent No.: US 6,948,084 B1
(45) Date of Patent: Sep. 20, 2005

(54) METHOD FOR INTERFACING A SYNCHRONOUS MEMORY TO AN ASYNCHRONOUS MEMORY INTERFACE AND LOGIC OF SAME

(75) Inventors: Rajesh Manapat, San Jose, CA (US); Kannan Srinivasagam, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 624 days.

(21) Appl. No.: 09/861,026

(22) Filed: May 17, 2001

(51) Int. Cl.[7] .......... G06F 1/12
(52) U.S. Cl. .......... 713/400; 365/189.01; 365/233; 711/167
(58) Field of Search .......... 365/189.01, 233; 711/167; 713/400

(56) References Cited

U.S. PATENT DOCUMENTS

| | | | | |
|---|---|---|---|---|
| 5,398,212 | A * | 3/1995 | Imura et al. | 365/230.08 |
| 5,625,593 | A * | 4/1997 | Kimura | 365/189.05 |
| 5,926,434 | A * | 7/1999 | Mori | 365/233 |
| 6,178,138 | B1 * | 1/2001 | Derbenwick et al. | 365/233 |
| 6,532,522 | B1 * | 3/2003 | Barth et al. | 711/167 |
| 6,658,544 | B2 * | 12/2003 | Gray | 711/167 |

* cited by examiner

*Primary Examiner*—Thomas Lee
*Assistant Examiner*—Albert Wang
(74) *Attorney, Agent, or Firm*—Wagner, Murabito & Hao LLP

(57) ABSTRACT

A method and logic for providing an asynchronous interface to a synchronous memory is disclosed. One embodiment of the present invention provides for a memory having a first logical unit which is operable to generate a synchronized clock signal in response to a chip select signal to the memory. The memory comprises synchronous memory arrays. The synchronized clock signal is input to the selected synchronous memory array. This allows an access to the synchronous memory to complete within a timing budget of the asynchronous interface. Furthermore, the memory has a second logical unit which is operable, in response to the chip select signal and a second signal input to the memory, to put an input/output bus coupled to the synchronous memory into a high impedance state by the end of the memory access. The second input signal may be a read enable or a write enable signal.

17 Claims, 7 Drawing Sheets

METHOD FOR INTERFACING A SYNCHRONOUS MEMORY TO AN ASYNCHRONOUS MEMORY INTERFACE AND LOGIC OF SAME

FIELD OF THE INVENTION

The present invention relates to the field of computer memories. Specifically, the present invention relates to a method which provides an asynchronous interface for a synchronous memory.

BACKGROUND ART

As is well known, as technology progresses applications using computer readable memories require greater amounts of memory. Unfortunately, existing technology is running into density limitations with respect to the fabrication of asynchronous memories. For example, the highest density asynchronous SRAM presently known is a 4M SRAM. Thus, creating asynchronous memories with the desired density requires the use of multiple smaller asynchronous memories, which is undesirable.

It is possible, however, to manufacture synchronous SRAMs with higher density than asynchronous memories. Thus, one technique of providing for higher density asynchronous SRAMs is to create a customized solution for using a synchronous memory as an asynchronous memory. For example, a synchronous SRAM may be allowed to be used asynchronously under specific conditions and rules. However, the customized solution does not allow the synchronous SRAM to be used under general conditions, using a standard existing asynchronous interface. Furthermore, because this solution is for a customized design, the control of the interface may be complicated.

An additional shortcoming with asynchronous memories is that asynchronous memories tend to have shorter product lifetimes than synchronous memories. Consequently, designs created with asynchronous memories may need to be re-designed more frequently than designs using synchronous memories.

SUMMARY OF THE INVENTION

Therefore, it would be advantageous to provide a method which provides for asynchronous memories of higher density than conventional fabrication methods allow. It would also be advantageous to limit the number of memories required to construct a higher density asynchronous memory. A still further need exists for such a memory having a control interface that is easy to use.

The present invention provides a method which interfaces a synchronous memory to an asynchronous memory interface, as well as logic of the same. Embodiments provides for a memory having an asynchronous interface with higher density modules than conventional fabrication processes generally allow. Thus, the present invention requires fewer modules to construct a high density memory. Furthermore, embodiments provide for a standard asynchronous interface, which simplifies the control of the memory. The present invention provides these advantages and others not specifically mentioned above but described in the sections to follow.

A method and logic for providing an asynchronous interface to a synchronous memory is disclosed. One embodiment of the present invention provides for a memory having a first logical unit which is operable to generate a synchronized clock signal in response to a chip select signal to the memory. The memory comprises synchronous memory arrays. The synchronized clock signal is input to the selected synchronous memory array. This allows an access to the synchronous memory to complete within a timing budget of the asynchronous interface. Furthermore, the memory has a second logical unit which is operable, in response to the chip select signal and a second signal input to the memory, to put an input/output bus coupled to the synchronous memory into a high impedance state by the end of the memory access. The second input signal may be a read enable or a write enable signal.

Another embodiment provides for a method of providing an asynchronous interface for a synchronous memory. The method first recites the step of inputting a plurality of signals into the asynchronous interface. The method of this embodiment then recites generating, from a first signal of the plurality, a timing signal for the synchronous memory. The method also recites inputting the timing signal into a clock input of the synchronous memory. Next, the method recites, in response to the first signal of the plurality and a second signal of the plurality causing a bus coupled to the synchronous memory to be put into a high impedance state at the conclusion of the memory access.

DETAILED DESCRIPTION OF THE INVENTION

In the following detailed description of the present invention, a method for providing an asynchronous interface for a synchronous memory array, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

SYNCHRONOUS MEMORY TO AN ASYNCHRONOUS MEMORY INTERFACE

The present invention comprises a method providing an asynchronous interface for a synchronous memory and logic of the same. The present invention provides a memory which comprises a synchronous memory, and thus must meet synchronous timing requirements for memory access. However, the interface to the memory is compatible with asynchronous timing requirements. Thus, embodiments of the present invention provide circuitry to conform the synchronous timing to asynchronous timing requirements.

Figure 1A:
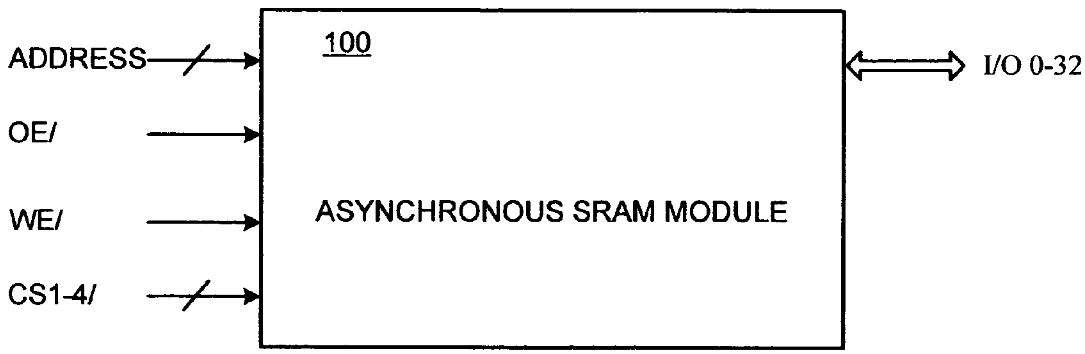
FIG. 1A is a diagram of an asynchronous SRAM module showing various inputs and outputs, according to an embodiment of the present invention.
Figure 1B:
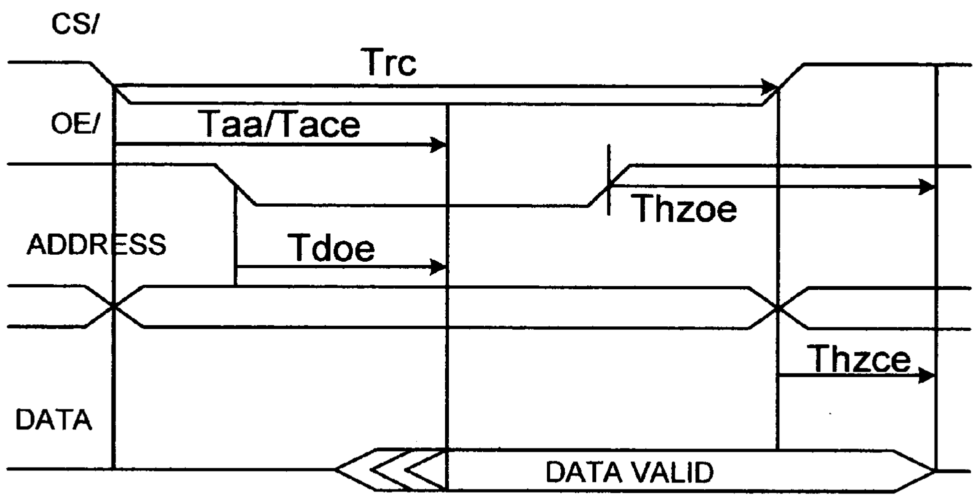
FIG. 1B is a diagram of an asynchronous read cycle timing of the asynchronous SRAM module of FIG. 1A, which embodiments of the present invention provide.
Figure 1C:
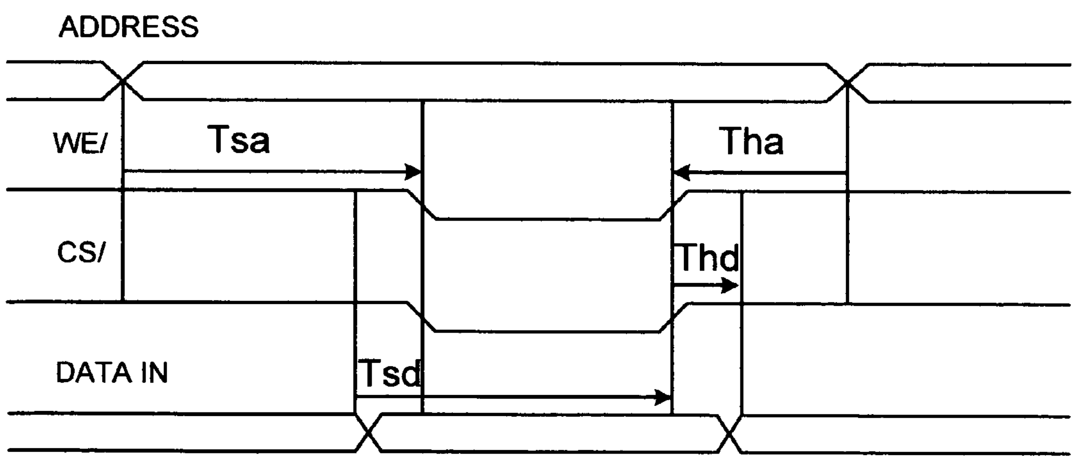
FIG. 1C is a diagram of an asynchronous write cycle timing of the asynchronous SRAM module of FIG. 1A, which embodiments of the present invention provide.

FIG. 1A shows a block diagram of an asynchronous memory module 100, which embodiments of the present invention function as without using asynchronous memory (e.g., by using synchronous SRAMs). The asynchronous memory 100 has input address lines, chip select lines, read enable (OE) and write enable (WE) control signals, as well as input/output lines. The present invention is well suited to additional control signals. FIG. 1B and FIG. 1C illustrate the read and write cycle times for the asynchronous memory 100. Referring now to FIG. 1B, the read cycle time ($T_{rc}$) is from when chip select (CS) goes low until the CS goes high. The data is valid when the address to data valid ($T_{AA}$), the CS low to data valid ($T_{ACE}$), and the read enable low to data valid ($T_{doe}$) times have been met. The data bus is tri-stated after either the read enable to high impedance ($T_{hzoe}$) or the chip select to high impedance ($T_{hzce}$) times are met. Thus, FIG. 1B describes the control signals which may be used to read from the synchronous memory via the asynchronous interface.

FIG. 1C illustrates timing parameters for a generic asynchronous write cycle, which describe the control for writing to the synchronous memory via the asynchronous interface. The address must be set up for the address set-up time ($T_{as}$) before the write enable (WE) goes low and the address must be held for the address hold time ($T_{ha}$) after the write enable goes inactive. The data must be set up for the data set-up time ($T_{sd}$) before the write enable end and must be held for the data hold time ($T_{hd}$) after the write enable goes high.

Figure 2A:
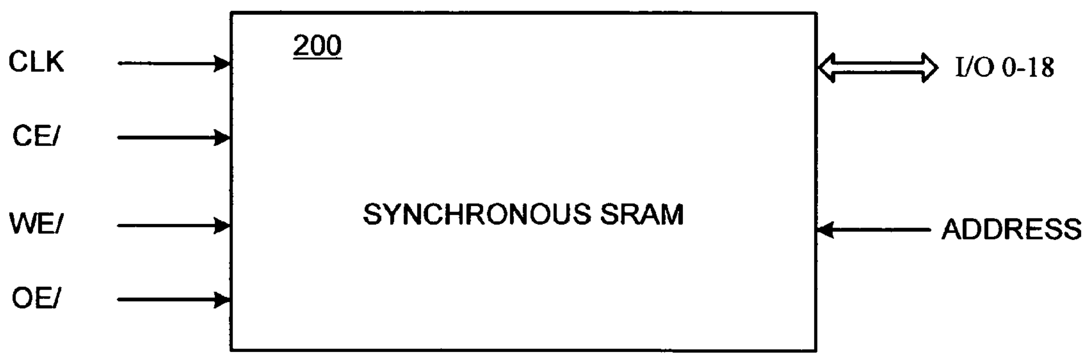
FIG. 2A is a diagram of a synchronous SRAM module showing various inputs and outputs, which is used in embodiments of the present invention.
Figure 2B:
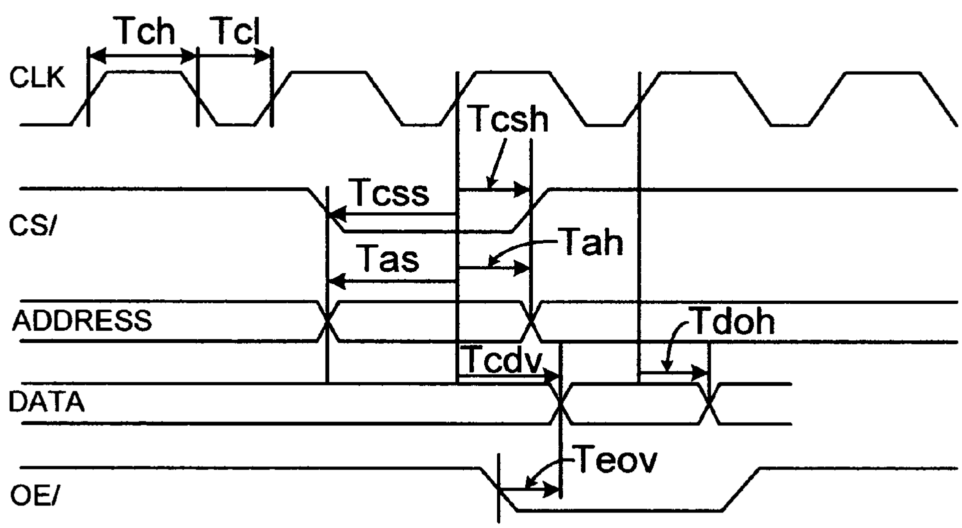
FIG. 2B is a diagram of a synchronous read cycle timing of the synchronous SRAM module of FIG. 2A used in embodiments of the present invention.

FIG. 2A illustrates a synchronous memory 200 with the inputs: clock, chip enable (CE), write enable (WE), read enable (OE), address lines, and an input/output bus (I/O). FIG. 2B illustrates read cycle timing for the synchronous memory 200 of FIG. 2A. The present invention is able to match the synchronous read timing cycle of FIG. 2B, which is constrained by the synchronous memory, to the asynchronous read cycle of FIG. 1B, provided by the asynchronous interface of embodiments of the present invention. The synchronous memory 200 shown operates on the rising clock edge between the clock low ($T_{cl}$) and the clock high ($T_{ch}$). However, operating on the falling clock edge may also be done. The chip enable (CS) must go active (low), at a minimum, a time of the chip enable set-up time ($T_{css}$) before the rising edge of he clock and must stay active at least the chip enable hold time ($T_{csh}$) after the rising edge of the clock. In a similar fashion, the address must be set up at least the address set-up time ($T_{as}$) before the rising edge of the clock and must be held for at least the address hold time ($T_{ah}$) after the rising edge of the clock. After the clock rise, the data is valid after a maximum time of the data output valid after clock rise time ($T_{cdv}$). The data is valid a minimum time after the rising clock edge of the data output hold time ($T_{doh}$). Finally, the output enable low to output valid ($T_{eov}$) time is shown.

Figure 2C:
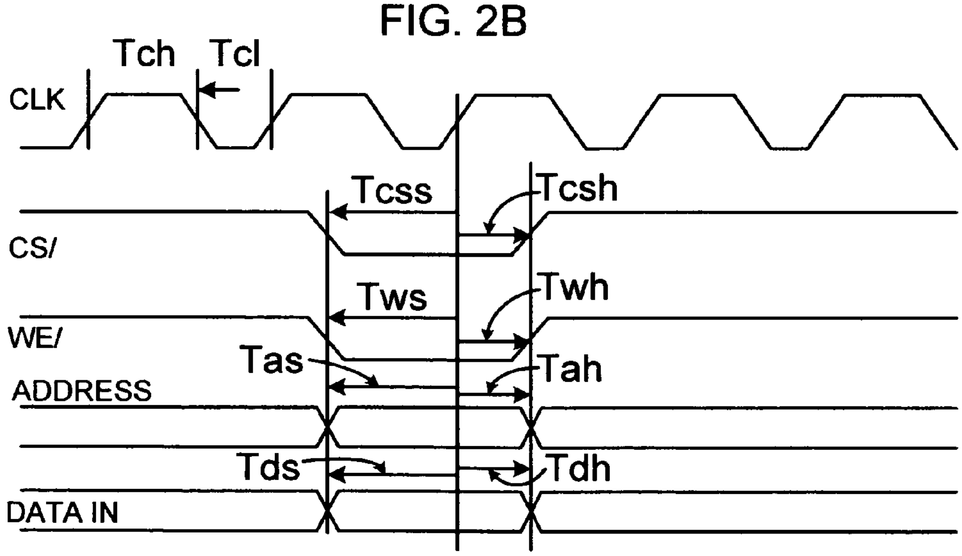
FIG. 2C is a diagram of a synchronous write cycle timing of the synchronous SRAM module of FIG. 2A used in embodiments of the present invention.

FIG. 2C illustrates a write cycle time for the synchronous memory 200, which is matched to the write cycle timing of the asynchronous memory of FIG. 1C by embodiments of the present invention. The chip enable (CS) must go active (low), at a minimum, a time of the chip enable set-up time ($T_{css}$) before the rising edge of the clock and must stay active at least the chip enable hold time ($T_{csh}$) after the rising edge of the clock. In a similar fashion, the address must be set up at least the address set-up time ($T_{as}$) before the rising edge of the clock and must be held for at least the address hold time ($T_{ah}$) after the rising edge of the clock. The write set-up time ($T_{ws}$) before the rising edge of the clock and the write hold time ($T_{wh}$) after the rising edge of the clock are also shown. Finally, the data input set-up time ($T_{ds}$) before the rising clock and the data input hold time ($T_{dh}$) after the rising edge of the clock are shown.

Figure 3:
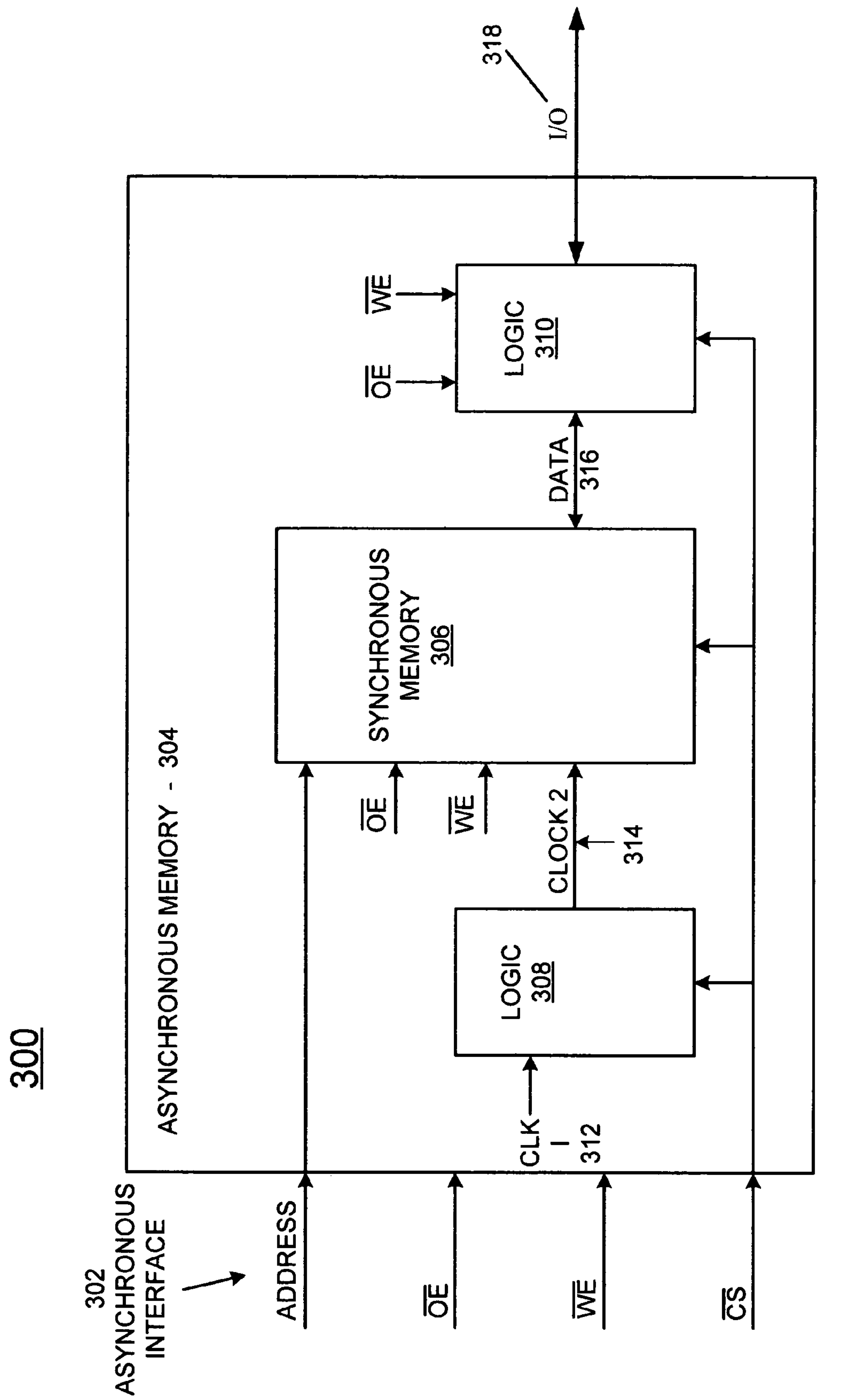
FIG. 3 is a logical block diagram illustrating a memory having an asynchronous interface and a synchronous memory array, according to an embodiment of the present invention.

FIG. 3 illustrates a block diagram 300 of an embodiment of the present invention with an asynchronous interface 302. The inputs and outputs to the asynchronous memory 304 are conventional asynchronous inputs. The asynchronous memory 304 comprises a synchronous memory array 306 and two logical units 308 and 310. The first logical unit 308 inputs an un-synchronized clock 312 and the chip select signal (CS) and outputs a synchronized clock 314 to the synchronous memory 306. By synchronized clock 314 it is meant synchronized with the incoming signals on the asynchronous interface 302 such that a synchronous memory access may be performed, as shown in FIG. 2B and FIG. 2C. The second logical unit 310, which is coupled to the synchronous memory 306 via the data bus 316, inputs the read enable signal (OE), the write enable signal (WE), and the chip select (CS). From these signals the second logical unit 310 puts the input/output bus 318 into a high impedance state (e.g., tri-state the bus) by the time necessary to meet the timing constraints for a generic asynchronous interface, such as shown in FIG. 1B and FIG. 1C.

Figure 4:
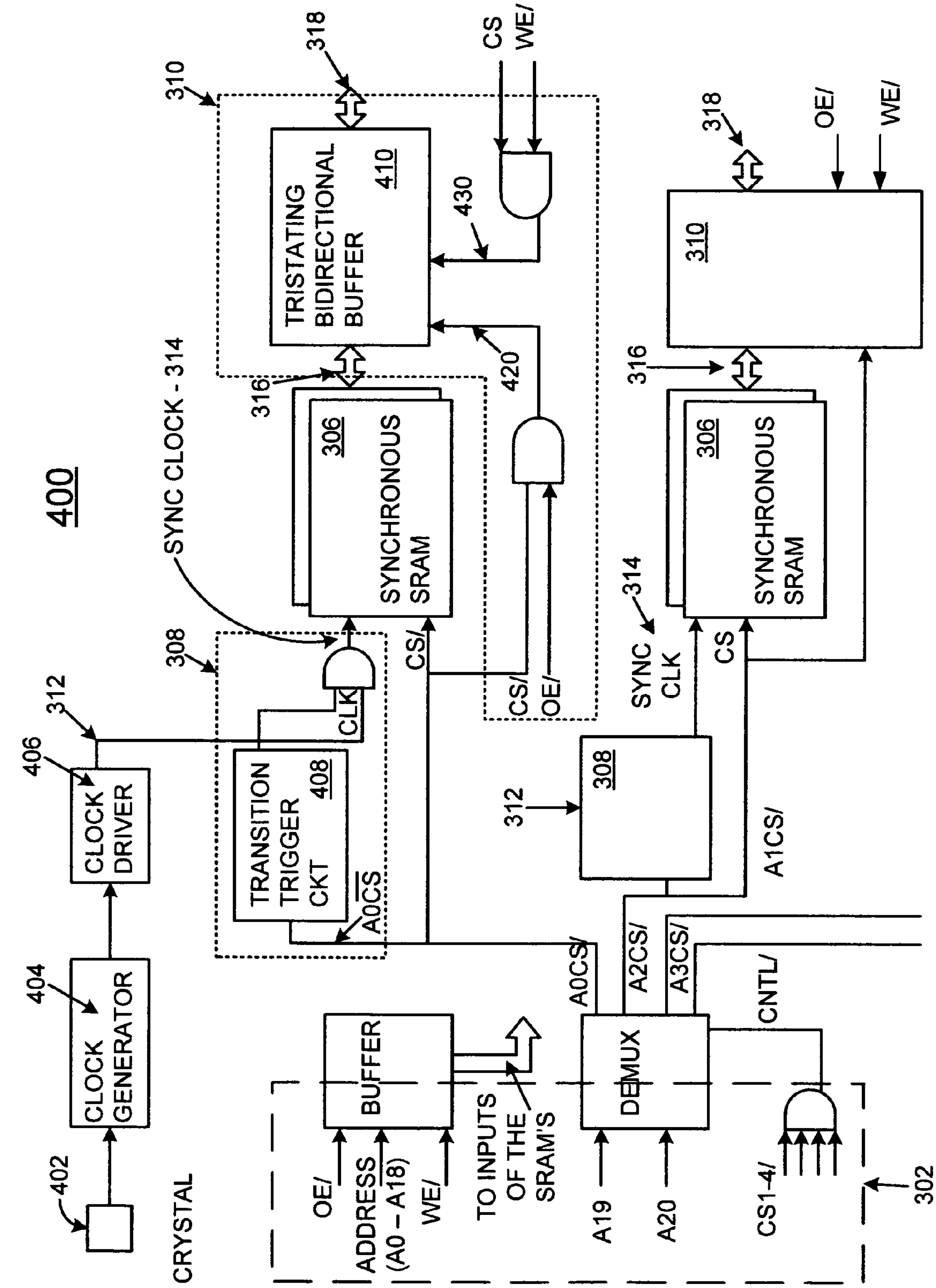
FIG. 4 is a logical block diagram illustrating features of the memory of FIG. 3, according to an embodiment of the present invention.
Figure 4:
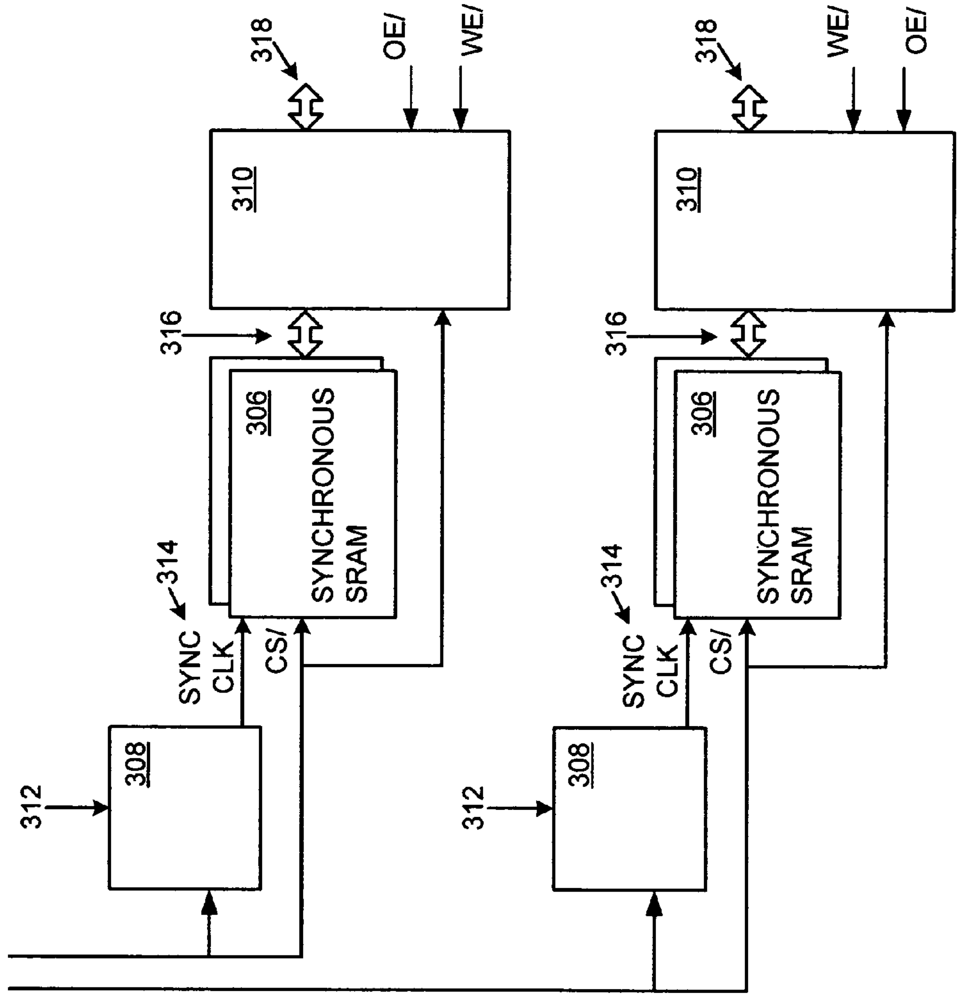

FIG. 4 illustrates a block diagram 400 with further details of an embodiment of the present invention with an asynchronous interface 302 and synchronous memory arrays 306. This embodiment has a first logical unit 308 coupled to each synchronous memory 306 (e.g., synchronous SRAM). The first logical unit 308 is operable to generate a synchronous timing signal which allows an access to a synchronous memory 306 to complete within a timing budget of an asynchronous interface 302. The first logical unit 308 has transition trigger circuit 408, which detects the transition of an input signal, for example, a chip select (CS) signal. In one embodiment, the detection circuit 408 outputs a pulse in response to the chip select (CS) going low. A crystal 402, a clock generator 404, and a clock driver 406 are used to feed an un-synchronized clock signal 312 into the first logical unit 308. The first logical unit 308 generates a synchronized clock signal 314, which is input to the synchronous memory array 306, which is selected by the chip select.

Figure 5:
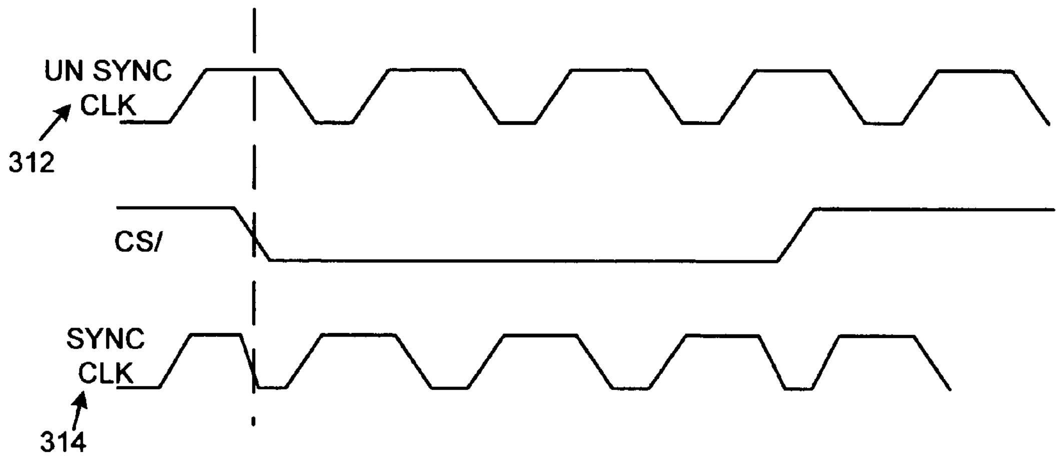
FIG. 5 is a timing diagram of the signals of the logical circuitry of the clock generation circuitry of FIG. 4, according to embodiments of the present invention.

Referring now to FIG. 5, the un-synchronized clock 312, the chip select (CS), and the synchronized clock 314 are shown. When the chip select transitions to low, the synchronized clock 314 is forced low by the second logic 308 for a period of time. This time period should be at least equal to the chip select set-up time $T_{css}$. This time may be controlled by the RC value of the transition detection circuit 408, which controls the width of the pulse output by the transition detection circuit 408. After the period of time, the synchronized clock 314 is allowed to go back to normal operation. By normal operation, it is meant that the synchronized clock 314 will mirror the un-synchronized clock 312, although there may be a delay.

Figure 6A:
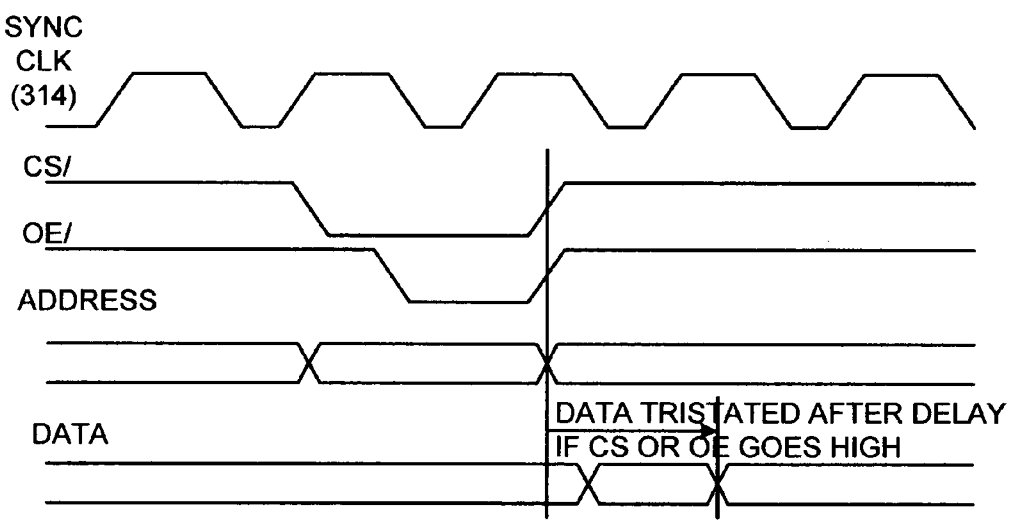
FIG. 6A is a timing diagram of the signals which are part of the buffer circuitry of FIG. 5, according to embodiments of the present invention.

Referring again to FIG. 4, the diagram 400 shows a second logical unit 310, which comprises a tri-stating bi-directional buffer 410. The chip select (CS) and the read enable (OE) signal are used to generate a signal 420, which is fed into the tri-stating buffer 410 to cause the buffer to tri-state at the appropriate time at the end of a read memory access. Referring now to FIG. 6A, the data will be tri-stated, after a delay, if either chip select (CS) or read enable (OE) go inactive (e.g., high). In this fashion, the I/O bus 318 is tri-stated within the time necessary for the timing requirements of the asynchronous interface 302.

Figure 6B:
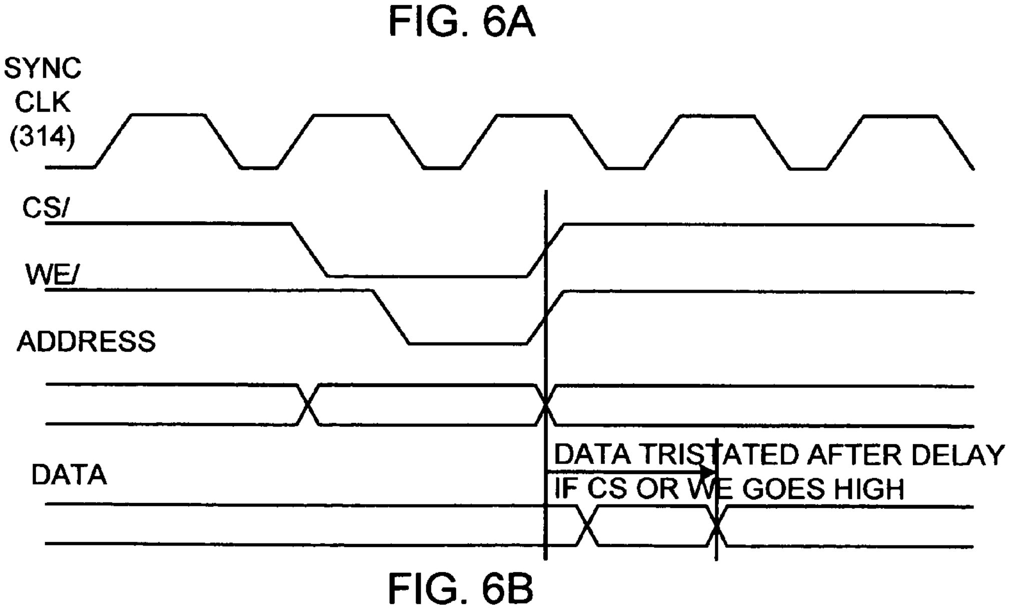
FIG. 6B is a timing diagram of the signals which are part of the buffer circuitry of FIG. 5, according to embodiments of the present invention.

In a similar fashion, FIG. 4 shows the chip select and the write enable (WE) being used to generate a signal 430, which is fed into the tri-stating buffer 410 to cause the buffer to tri-state at the appropriate time at the end of a write memory access. Referring now to FIG. 6B, the data will be tri-stated, after a delay, if either chip select (CS) or write enable (WE) go inactive (e.g., high). In this fashion, the I/O bus 318 is tri-stated within the time necessary for the timing requirements of the asynchronous interface 302.

Figure 7:
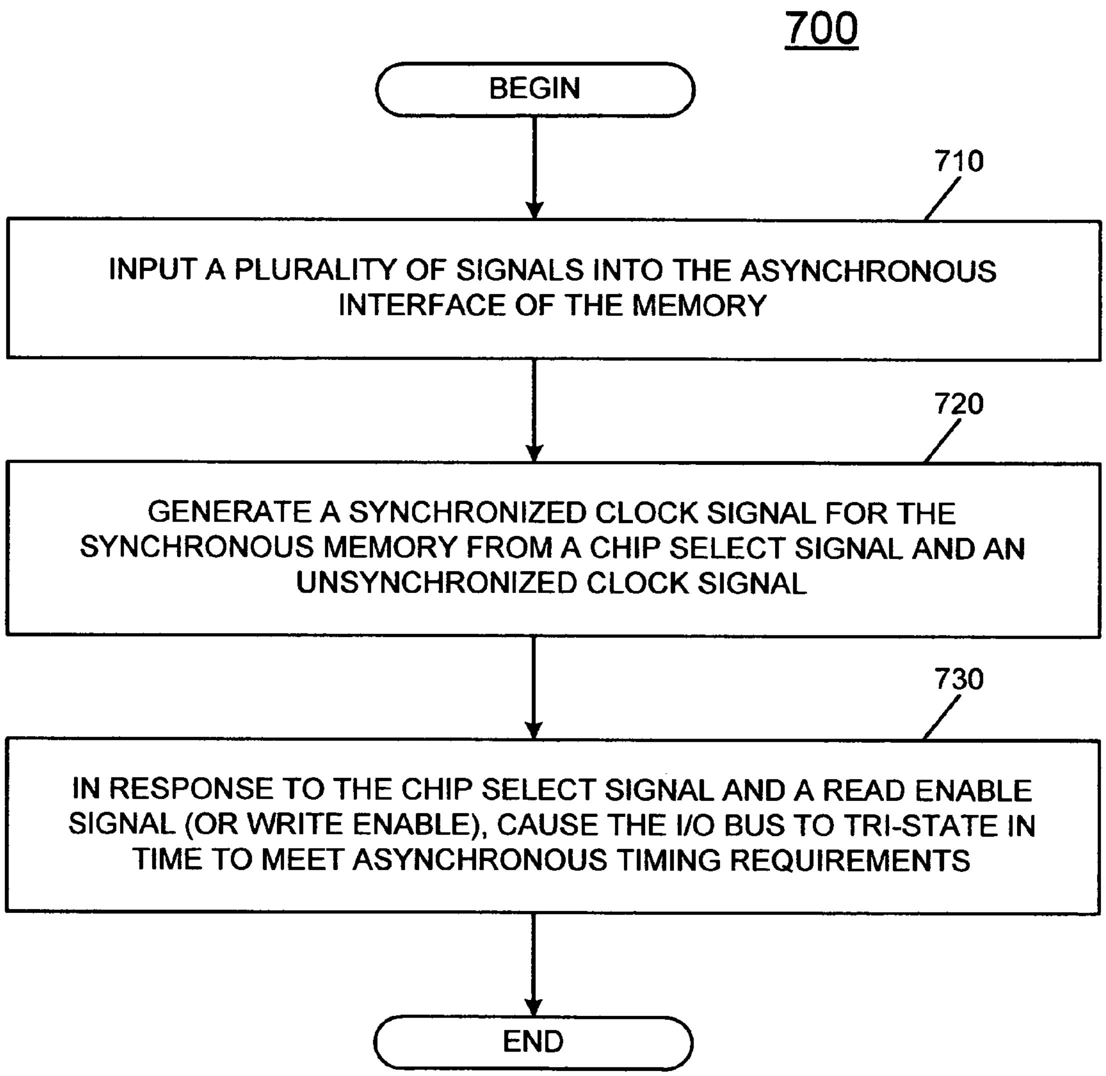
FIG. 7 is a flowchart of the steps of a process of providing an asynchronous interface for a synchronous memory, according to embodiments of the present invention.

An embodiment of the present invention provides for a method of providing an asynchronous interface 302 to a synchronous memory array 306, as shown in FIG. 7. In step 710, the process 700 receives a plurality of signals into an interface that is operable as a generic asynchronous memory interface 302, such as, for example, those signals described herein with reference to FIG. 1A through FIG. 1C.

In step 720, the process 700 generates a synchronized clock signal 314 for the synchronous memory 306, which is synchronized with the incoming asynchronous signals, such that the data may be read in or out within the asynchronous timing budgets, as shown in FIG. 1B and FIG. 1C. The synchronized clock signal 314 may be generated from a chip select signal and an un-synchronized clock signal 312. The un-synchronized clock signal 312 may be generated on the module which comprises the synchronous memory 306, although this is not required. By an un-synchronized clock signal 312 it is meant that the signal has not been synchronized to the plurality of asynchronous input signals in order to control a memory access.

In step 730, the process 700 causes the input/output bus 318 coupled to the synchronous memory 306 to go into a high impedance state (e.g., tri-state) in time for the asynchronous timing budgets, as shown in FIG. 1B and FIG. 1C. The process 700 may use the chip select signal along with a read or write enable control signal to trigger the high impedance state.

The preferred embodiment of the present invention, a method providing for an asynchronous interface for a synchronous memory and logic of the same, is thus described. While the present invention has been described in particular embodiments, it should be appreciated that the present invention should not be construed as limited by such embodiments, but rather construed according to the below claims.

We claim:

1. A memory having an asynchronous interface, said memory comprising:

first logic operable to generate a synchronized clock signal in response to an unsynchronized clock signal and a transition of a chip select signal;

a synchronous memory array; and wherein said synchronized clock signal is synchronized with said chip select signal to satisfy a timing constraint of said synchronous memory array and is input to said synchronous memory array to allow a synchronous access to said synchronous memory array, and wherein data is transferred asynchronously on said asynchronous interface.

2. The memory having said asynchronous interface of claim 1, further comprising second logic operable, in response to said chip select signal and a second input signal to said memory, to put an input/output bus coupled to said synchronous memory array into a high impedance state substantially at the end of said synchronous access.

3. The memory having said asynchronous interface of claim 2 wherein:

said second logic comprises a tri-stating bi-directional buffer; and said second logic is operable to generate a signal that is input to said tri-stating bi-directional buffer to put said input/output bus into said high impedance state.

4. The memory having said asynchronous interface of claim 2 wherein said second input signal is a read enable.

5. The memory having said asynchronous interface of claim 2 wherein said second input signal is a write enable.

6. The memory having said asynchronous interface of claim 1 wherein said asynchronous interface comprises a plurality of inputs which do not include a clock input.

7. A method of providing an asynchronous interface for a synchronous memory, said method comprising the steps of:

a) in response to a clock signal and a transition of a chip select signal for selecting said synchronous memory, generating a timing signal for allowing synchronous memory access to said synchronous memory using asynchronous control signals, wherein said timing signal is synchronized with said chip select signal to satisfy a timing constraint of said synchronous memory; and b) inputting said timing signal to said synchronous memory, wherein data is transferred asynchronously on said asynchronous interface.

8. A method as described in claim 7 further comprising the step of:

c) in response to said chip select signal and a second input signal to said asynchronous interface, putting a bus coupled to said synchronous memory into a high impedance state substantially at the end of said memory access.

9. A method as described in claim 8 wherein said step c) comprises the step of:

c1) in response to said chip select signal and a read enable signal, putting said bus into said high impedance state.

10. A method as described in claim 8 wherein said step c) comprises the step of:

c1) in response to said chip select signal and a write enable signal, putting said bus into said high impedance state.

11. A method as described in claim 7, wherein said step a) comprises the steps of:

a1) generating said clock signal; and a2) generating said timing signal by modifying said clock signal in response to said chip select signal.

12. A method as described in claim 11, wherein said step a2) comprises the steps of:

i) detecting a transition of said chip select signal;

ii) in response to said transition, bringing said clock signal to zero; and iii) allowing said clock signal to return to normal operation, wherein said timing signal is formed by modifying said clock signal in response to said chip select signal.

13. A method as described in claim 12 wherein said timing signal is allowed to return to said normal operation, at a minimum, a chip selection setup time after said chip select signal transition is detected.

14. A method of providing an asynchronous interface for a synchronous memory, said method comprising the steps of:

a) receiving a plurality of signals on said asynchronous interface;

b) in response to an unsynchronized clock signal and a chip select signal formed from said plurality of signals and for selecting said synchronous memory, generating a synchronized clock signal for said synchronous memory, wherein said synchronized clock signal allows said plurality of signals and said synchronized clock signal to control a synchronized memory access to said synchronous memory, and wherein said synchronized clock signal is synchronized with said chip select signal to satisfy a chip select setup time of said synchronous memory;

c) in response to said chip select signal and a second signal of said plurality of signals, causing a bus coupled to said synchronous memory to be put into a high impedance state substantially at the end of said synchronized memory access; and d) transferring data asynchronously on said asynchronous interface.

15. A method of providing an asynchronous interface for a synchronous memory as described in said claim 14, wherein said step b) comprises the step of:

b1) generating said unsynchronized clock signal; and b2) generating said synchronized clock signal by forming a logical AND of said unsynchronized clock signal and said chip select signal.

16. A method of providing an asynchronous interface for a synchronous memory as described in said claim 14, wherein said step c) comprises the step of:

c1) in response to a transition of said chip select signal and a read enable signal of said plurality of signals, causing a bus coupled to said synchronous memory to be put into a high impedance state.

17. A method of providing an asynchronous interface for a synchronous memory as described in said claim 14, wherein said step c) comprises the step of:

c1) in response to a transition of said chip select signal and a write enable signal of said plurality of signals, causing a bus coupled to said synchronous memory to be put into a high impedance state.

* * * * *